United States Patent
Ham

(10) Patent No.: US 12,416,689 B2
(45) Date of Patent: Sep. 16, 2025

(54) INTERLOCK DIAGNOSING SYSTEM AND METHOD FOR A HIGH VOLTAGE DEVICE

(71) Applicants: HYUNDAI MOTOR COMPANY, Seoul (KR); KIA CORPORATION, Seoul (KR)

(72) Inventor: Keun Bong Ham, Yongin-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 0 days.

(21) Appl. No.: 18/223,401

(22) Filed: Jul. 18, 2023

(65) Prior Publication Data

US 2023/0358824 A1    Nov. 9, 2023

Related U.S. Application Data

(63) Continuation of application No. 17/380,437, filed on Jul. 20, 2021, now Pat. No. 11,747,406.

(30) Foreign Application Priority Data

Nov. 3, 2020    (KR) .................. 10-2020-0145378

(51) Int. Cl.
G01R 31/68    (2020.01)

(52) U.S. Cl.
CPC .................. G01R 31/68 (2020.01)

(58) Field of Classification Search
CPC ........ G01R 31/68; G01R 31/54; G01R 31/66; G01R 15/04; G01R 27/02; G01R 27/08; G01R 31/56
See application file for complete search history.

(56) References Cited

U.S. PATENT DOCUMENTS

| | | | |
|---|---|---|---|
| 2016/0214485 A1* | 7/2016 | Butzmann | B60L 3/0046 |
| 2018/0356454 A1* | 12/2018 | Burkman | G01R 31/66 |
| 2020/0094682 A1* | 3/2020 | Zeng | B60L 3/04 |
| 2022/0009351 A1* | 1/2022 | Fu | B60L 3/0023 |
| 2022/0011762 A1* | 1/2022 | Li | G05B 23/0256 |
| 2022/0043045 A1* | 2/2022 | Edelhauser | B60L 3/04 |

FOREIGN PATENT DOCUMENTS

| | | |
|---|---|---|
| KR | 101567261 B1 | 11/2015 |
| KR | 101708822 B1 | 2/2017 |

* cited by examiner

*Primary Examiner* — Akm Zakaria
(74) *Attorney, Agent, or Firm* — Lempia Summerfield Katz LLC

(57) ABSTRACT

An interlock diagnosing system and method for a high voltage device includes: a detection circuit between a transmitter providing a voltage and a receiver receiving the voltage provided by the transmitter; a plurality of resistors connected in parallel to the detection circuit via a respective plurality of connectors engaged between the plurality of resistors and the detection circuit; and a detector detecting engaged states of the plurality of connectors based on at least one of the voltage provided by the transmitter or the voltage received by the receiver, or both. The detector calculates a resistance value of the detection circuit based on the voltage provided by the transmitter and the voltage received by the receiver and detects the engaged states of the plurality of connectors based on the calculated resistance value. Each resistor has a different resistance value from each other. The detector detects a disengaged connector among the plurality of connectors based on the calculated resistance value.

10 Claims, 3 Drawing Sheets

INTERLOCK DIAGNOSING SYSTEM AND METHOD FOR A HIGH VOLTAGE DEVICE

CROSS REFERENCE TO RELATED APPLICATION

The present application is a continuation of U.S. application Ser. No. 17/380,437 filed Jul. 20, 2021 and which claims priority to Korean Patent Application No. 10-2020-0145378, filed Nov. 3, 2020. The entire contents of these prior filed applications are incorporated herein for all purposes by this reference.

BACKGROUND

1. Technical Field

The present disclosure relates to an interlock circuit for checking an engagement of a connector connected to a high voltage junction box applied to an eco-friendly vehicle.

2. Description of the Related Art

When configuring a high voltage circuit for an eco-friendly vehicle including a hybrid vehicle, an electric vehicle, a fuel cell vehicle, or the like, it is required to obey safety regulations for preventing disconnection of a high voltage connector or reducing a voltage when the connector is disconnected, so that a driver or an operator may be prevented from being exposed to the high voltage while the high voltage used to drive the eco-friendly vehicle is activated.

Especially, the safety regulations include the condition that a voltage of a conductor component should be reduced to DC 60 V or lower or AC 30 V(RMS) or lower within one second after the connector is disconnected. In order to satisfy the condition, the vehicle needs to have the function to recognize the disconnection of the connector and the function to discharge electricity such that the voltage is reduced to a reference value or lower in a short period of time. When the disconnection of the connector is recognized, it is required to perform control for activating the discharging function.

As a means for sensing the disconnection of the connector, an interlock circuit is mainly used. The interlock circuit may identify an engaged state of the connector, because a closed circuit is formed when the connector is engaged, and an open circuit is formed when the connector is disengaged/disconnected. As a means for reducing the voltage of the exposed conductor when the connector is disconnected, a method of blocking a voltage source such as a high voltage battery from a high voltage path, a method of discharging energy remaining in a capacitor or the like on the high voltage path, or the like is used.

An interlock detection circuit according to the conventional art includes a first circuit line installed in a connector and a second circuit line installed in an inlet, and the second circuit line is connected to a power supply and a detector for the interlock detection circuit.

In particular, when the connector is in a normally engaged state, the power supply and the detector connected to the interlock detection circuit, the second circuit line of the inlet, and the first circuit line of the connector form one closed circuit. On the other hand, when the connector is disengaged from the inlet, an open circuit is formed, and at this time, the power supply and the detector may measure voltages of both ends of the interlock circuit to determine whether or not the connector is engaged.

According to the conventional art, one controller is capable of recognizing which one among a plurality of connectors is disengaged by monitoring the interlock circuit, which passes through the plurality of connectors. However, resistors of the interlock circuit are connected to each other in series, resulting in a problem in that when the resistor is burned out and is in a directly connected state (causing a short circuit), the connector is recognized as being normally connected.

The contents described as the related art have been provided only to assist in understanding the background of the present disclosure and should not be considered as corresponding to the related art known to those having ordinary skill in the art.

SUMMARY

An object of the present disclosure is to provide a technology for accurately diagnosing an interlock of a connector by eliminating an influence of a short circuit of a resistor on the diagnosis of the interlock of the connector.

According to an embodiment of the present disclosure, an interlock diagnosing system for a high voltage device includes: a detection circuit extending between a transmitter providing a voltage and a receiver receiving the voltage provided by the transmitter; a plurality of resistors, each being connected in parallel to the detection circuit via a respective one of a plurality of connectors engaged between the plurality of resistors and the detection circuit; and a detector detecting engaged states of the plurality of connectors based on the voltage provided by the transmitter or the voltage received by the receiver.

The plurality of resistors may be included in an integrated resistor board.

The transmitter may include a voltage provider and a voltage dividing resistor for dividing the voltage provided by the voltage provider.

Each of the plurality of connectors may be connected to the detection circuit and any one of the plurality of resistors, and connect the resistor connected thereto in an engaged state to the detection circuit in parallel.

The detector may calculate a resistance value of the detection circuit based on the voltage provided by the transmitter and the voltage received by the receiver and may detect the engaged states of the plurality of connectors based on the calculated resistance value.

The plurality of resistors may have different resistance values from each other, and the detector may detect a disengaged one among the plurality of connectors based on the calculated resistance value.

According to another embodiment of the present disclosure, an interlock diagnosing method is disclosed for a high voltage device using an interlock diagnosing circuit. The interlock diagnosing circuit includes: a detection circuit extending between a transmitter providing a voltage and a receiver receiving the voltage provided by the transmitter; and a plurality of resistors, each being connected in parallel to the detection circuit via a respective one of a plurality of connectors engaged between the plurality of resistors and the detection circuit. The interlock diagnosing method includes detecting engaged states of the plurality of connectors based on the voltage provided by the transmitter or the voltage received by the receiver.

Before the detecting of the engaged states of the connectors, the interlock diagnosing method may further include calculating a resistance value of the detection circuit based on the voltage provided by the transmitter and the voltage received by the receiver. In the detecting of the engaged states of the connectors, the engaged states of the plurality of connectors may be detected based on the calculated resistance value.

The plurality of resistors each have different resistance values from each other. In the detecting of the engaged states of the connectors, a disengaged one among the plurality of connectors may be detected based on the calculated resistance value.

DETAILED DESCRIPTION OF THE EMBODIMENTS

Figure 1:
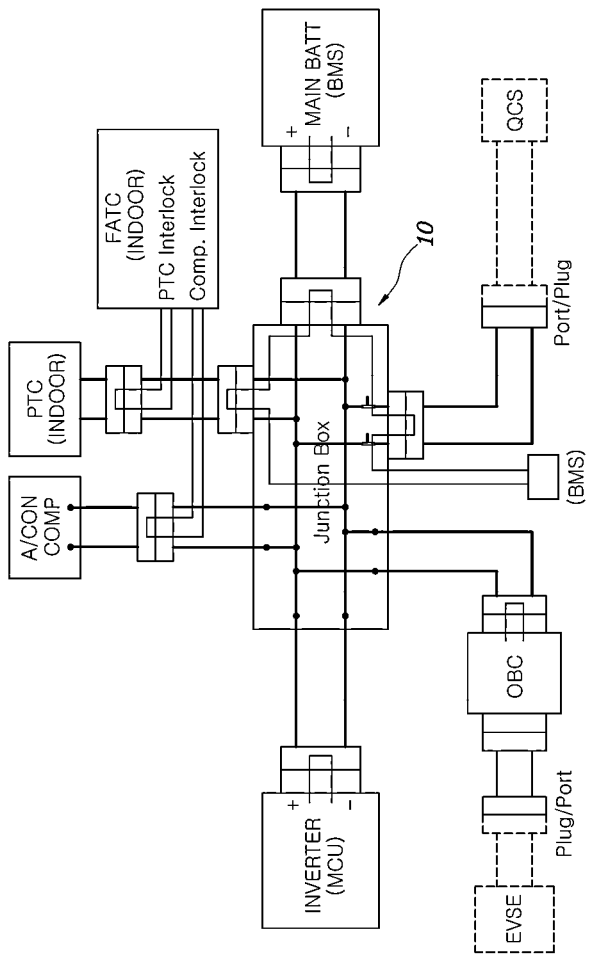
FIG. 1 is a diagram illustrating high voltage components of an eco-friendly vehicle and a circuit therefor according to an embodiment of the present disclosure.

Specific structural or functional descriptions of embodiments according to the present disclosure in the present specification or application are merely illustrative for the purpose of describing embodiments according to the present disclosure. Embodiments according to the present disclosure may be implemented in various forms and are not to be construed as being limited to the embodiments described in the present specification or application.

Since the embodiments according to the present disclosure may be modified in various ways and take on various alternative forms, particular embodiments are illustrated in the drawings and described in detail in the present specification or application. However, there is no intent to limit embodiments according to the concept of the present disclosure to the particular forms disclosed. The present disclosure should be construed as covering all modifications, equivalents, and alternatives falling within the spirit and technical scope of the present disclosure.

It should be understood that, although the terms "first", "second", and the like may be used herein to describe various elements, the elements are not limited by the terms. The terms are used only for the purpose of distinguishing one element from another element. For example, a first element may be named as a second element, and similarly, the second element may be named as the first element, without departing from the scope according to the concept of the present disclosure.

When a certain element is referred to as being "connected" or "coupled" to another element, the certain element may be directly connected or coupled to the other element, but it should be understood that another intervening element may exist therebetween. On the other hand, when a certain element is referred to as being "directly connected" or "directly coupled" to another element, it should be understood that no intervening element exists therebetween. Other expressions for describing relationship between elements, i.e. "between", "directly between", "adjacent to", "directly adjacent to", and the like, should also be construed in the same manner.

Terms used in the present specification are used only for describing specific embodiments and are not intended to limit the present disclosure. Unless the context clearly indicates otherwise, singular expressions include plural expressions. It should be further understood that the terms "include", "have", or the like in the present specification are used to specify the presence of stated features, numbers, steps, operations, elements, parts, or combinations thereof, but do not preclude the presence or addition of one or more other features, numbers, steps, operations, elements, parts, or combinations thereof.

Unless defined otherwise, all terms used herein, including technical and scientific terms, have the same meaning as commonly understood by those having ordinary skill in the art to which the present disclosure pertains. Terms such as those defined in generally used dictionaries should be interpreted to have meanings consistent with the contextual meanings in the relevant art. Such terms should not be interpreted to have ideal or excessively formal meanings unless clearly defined in the present specification.

Hereinafter, the present disclosure is described in detail by describing preferred embodiments of the present disclosure with reference to the accompanying drawings. Identical reference marks shown in each drawing are used to denote identical or equivalent elements. When a component, device, element, or the like of the present disclosure is described as having a purpose or performing an operation, function, or the like, the component, device, or element should be considered herein as being "configured to" meet that purpose or to perform that operation or function.

FIG. 1 is a diagram illustrating high voltage components of an eco-friendly vehicle and a circuit therefor according to an embodiment of the present disclosure.

Referring to FIG. 1, it may be seen that the high voltage components, such as an inverter, a main battery, an air compressor, and a positive temperature coefficient (PTC) device, are interconnected through connectors C1, C2, C3, and C4, and an interlock circuit passes through the connectors C1, C2, C3, and C4.

The interlock circuit for the plurality of connectors C1, C2, C3, and C4 connected to a high voltage battery, a PTC, and a quick charging port is configured as one circuit and detected by one controller (BMS) to simplify the configuration of the circuit and minimize the number of controllers used, thereby increasing efficiency.

When one of the plurality of connectors C1, C2, C3, and C4 is disengaged, it is possible to identify whether or not the disengagement has occurred. However, it is not possible to identify how many connectors among the connectors C1, C2, C3, and C4 are disengaged or what positions of connectors among the connectors C1, C2, C3, and C4 are disengaged. Accordingly, there has been difficulty in identifying an actual detection site, because it is required to examine all the connectors C1, C2, C3, and C4 connected to one interlock circuit.

As a key point of the present disclosure, in a case where one interlock circuit monitors portions at which the plurality of connectors C1, C2, C3, and C4 are engaged as described above, when disengagement is detected among the connectors C1, C2, C3, and C4, it is possible to accurately detect diagnostic information, such as positions of disengaged connectors and the number of disengaged connectors among the connectors C1, C2, C3, and C4.

Figure 2:
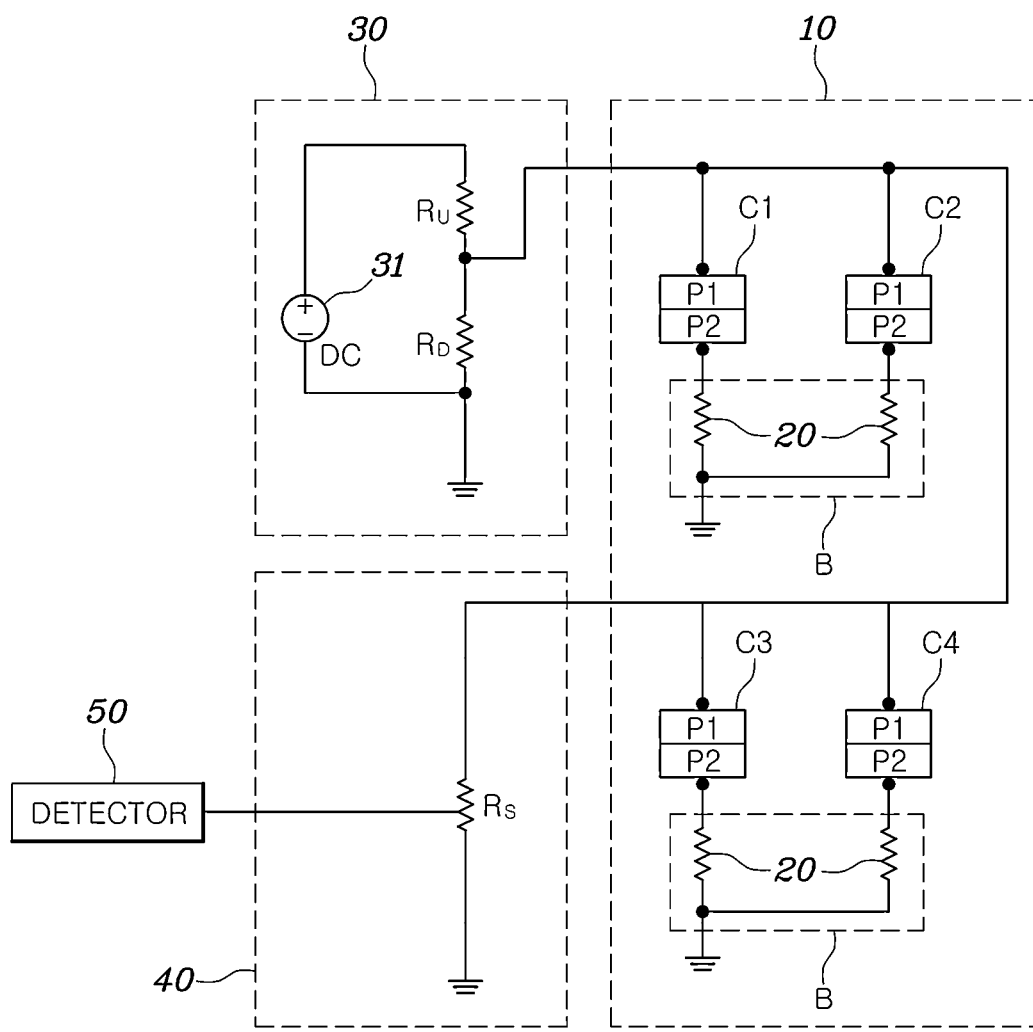
FIG. 2 is a configuration diagram of an interlock diagnosing system for a high voltage device according to an embodiment of the present disclosure.

FIG. 2 is a configuration diagram of an interlock diagnosing system for a high voltage device according to an embodiment of the present disclosure.

Referring to FIG. 2, the interlock diagnosing system for a high voltage device according to an embodiment of the present disclosure includes: a detection circuit 10 extending between a transmitter 30 providing a voltage and a receiver 40 receiving the voltage provided by the transmitter 30; a plurality of resistors 20, each being connected in parallel to the detection circuit 10 via a respective one of the plurality of connectors C1, C2, C3, and C4 engaged between the plurality of resistors 20 and the detection circuit 10; and a detector 50 detecting engaged states of the plurality of connectors C1, C2, C3, and C4, based on the voltage provided by the transmitter 30 or the voltage received by the receiver 40.

The detector 50 according to an embodiment of the present disclosure may be implemented through a nonvolatile memory (not shown) configured to store data associated with algorithms configured to control operations of various components for the vehicle or software instructions for reproducing the algorithms. The detector 50 may also be implemented through a processor (not shown) configured to perform operations described below using the data stored in the memory. Here, the memory and the processor may be implemented as separate chips. Alternatively, the memory and processor may be implemented as an integrated single chip. The processor may take the form of one or more processors.

The detection circuit 10 according to the present disclosure may be connected to circuits installed in the connectors C1, C2, C3, and C4 for connecting the high voltage components (such as an inverter, a main battery, an air compressor, and a PTC device) of the eco-friendly vehicle.

Specifically, the detection circuit 10 may be connected in parallel to the circuits installed in the connectors C1, C2, C3, and C4, while extending between the transmitter 30 providing a voltage and the receiver 40 receiving the voltage.

The plurality of resistors 20 may be connected to the detection circuit 10 via the connectors C1, C2, C3, and C4, respectively. In particular, when the connectors C1, C2, C3, and C4 connected to the respective resistors 20 are in an engaged state, the plurality of resistors 20 are connected to the detection circuit 10 through the circuits installed in the connectors C1, C2, C3, and C4. On the other hand, when the connectors C1, C2, C3, and C4 connected to the respective resistors 20 are in a disengaged state, the resistors 20 may be short-circuited with circuits for the resistors 20.

The detector 50 may detect a change in voltage and current values of the detection circuit 10, which vary depending on whether or not the plurality of resistors 20 are in a connected state, and determine whether or not the connectors C1, C2, C3, and C4 are in an engaged state. In particular, the detector 50 may determine whether or not the connectors C1, C2, C3, and C4 are in an engaged state based on the voltage provided by the transmitter 30 connected to the detection circuit 10 and the voltage received by the receiver 40.

Therefore, since the plurality of resistors 20 are connected in parallel to the detection circuit 10, it is possible to minimize an influence of the connectors C1, C2, C3, and C4 on failure of contact, disconnection, or short circuit.

In addition, when the connector C1, C2, C3, or C4 is disengaged, the detector 50 may reduce a voltage to 60 V or lower at an exposed portion of a high voltage circuit within one second, thereby protecting a user or an operator from electric shock.

The detector 50 senses a change of the interlock circuit when the connector C1, C2, C3, or C4 is disengaged, and transmits disengagement information of the connector C1, C2, C3, or C4 to other controllers through a controller area network (CAN) communication signal or the like.

Upon receiving this signal, the controllers cut off a main relay to disconnect the high voltage battery from a high voltage path, and forcibly discharge energy remaining in a capacitance component on the high voltage path.

In addition, the plurality of resistors 20 may be included in an integrated resistor board B. Specifically, the resistor board B may be integrated and modularized from the plurality of resistors 20.

More specifically, the transmitter 30 may include a voltage provider 31 and a voltage dividing resistor $R_U$ or $R_D$ for dividing the voltage provided by the voltage provider 31.

The voltage provider 31 may be a battery generating a direct current (DC) voltage. In an embodiment, the voltage provider 31 may generate a voltage of 13.5 V, 16 V, 8 V, or 5 V.

The voltage dividing resistor $R_U$ or $R_D$ may be a pull-up resistor $R_U$ in an embodiment or a pull-down resistor $R_D$ in another embodiment.

As illustrated, both the pull-up resistor $R_U$ and the pull-down resistor $R_D$ may be included. The detection circuit 10 may extend to the receiver 40 between the pull-up resistor $R_U$ and the pull-down resistor $R_D$ of the transmitter 30.

Each of the plurality of connectors C1, C2, C3, and C4 may be connected to the detection circuit 10 and any one of the plurality of resistors 20 and may connect the resistor 20 connected thereto in an engaged state to the detection circuit 10 in parallel.

In other words, the plurality of resistors 20 may be connected in parallel to the detection circuit 10 via the respective connectors C1, C2, C3, and C4. In particular, each of the connectors C1, C2, C3, and C4 may include a plurality of pins P1 and P2, with one pin P1 being connected to the detection circuit 10 and the other pin P2 being connected to the resistor 20.

The detector 50 may calculate a resistance value of the detection circuit 10 based on the voltage provided by the transmitter 30 and the voltage received by the receiver 40 and may detect engaged states of the plurality of connectors C1, C2, C3, and C4 based on the calculated resistance value.

Specifically, the detector 50 may calculate a combined resistance value of the resistors 20 connected to the detection circuit 10, based on the voltage provided by the transmitter 30 through the voltage provider 31 and a voltage of a receiving resistor $R_S$ included in the receiver 40.

More specifically, the plurality of resistors 20 may have different resistance values from each other, and the detector 50 may detect a disengaged connector C1, C2, C3, or C4 among the plurality of connectors C1, C2, C3, and C4 based on the calculated resistance value.

In an embodiment, in order to individually diagnose a position at which each of the plurality of connectors C1, C2, C3, and C4 is disengaged, the plurality of resistors 20 may have different resistance values from each other, thereby easily identifying which one of the connectors C1, C2, C3, and C4 is disconnected.

Table 1 below shows a result of the received voltage depending on whether or not the connectors C1, C2, C3, and C4 are engaged when the plurality of resistors 20 having different resistance values from each other are connected to the detection circuit 10 according to an embodiment.

TABLE 1

| | | | | | | | | | |
|---|---|---|---|---|---|---|---|---|---|
| Pull-up resistance | 10 | 10 | 10 | 10 | 10 | 10 | 10 | 10 | 10 |
| Interlock resistance | 4 | 10 | 12 | 15 | 18 | 20 | 24 | 27 | 30 |
| The number of engaged connectors | 0 | 1 | 2 | 3 | 4 | 5 | 6 | 7 | 8 |
| Received voltage (input voltage 13.5 V) | 4 | 2.85 | 2.30 | 2 | 1.8 | 1.65 | 1.54 | 1.46 | 1.39 |
| Received voltage (input voltage 16 V) | 4.57 | 3.55 | 3 | 2.66 | 2.44 | 2.26 | 2.14 | 2.04 | 1.95 |
| Received voltage (input voltage 8 V) | 2.28 | 1.77 | 1.5 | 1.33 | 1.22 | 1.13 | 1.07 | 1.02 | 0.97 |

The interlock resistance may be a combined resistance of the detection circuit 10 depending on the number of engaged connectors among the plurality of connectors C1, C2, C3, and C4. The received voltage may be a voltage applied to the receiving resistor $R_S$ included in the receiver 40.

The detector 50 may store the data in the table as described above and detect whether or not the connectors C1, C2, C3, and C4 are in an engaged state or the number of engaged connectors based on the sensed received voltage.

According to another embodiment, in order to diagnose the number of disengaged connectors among the plurality of connectors C1, C2, C3, and C4, the plurality of resistors 20 may have the same resistance value. Accordingly, it is possible to easily identify the number of disconnected connectors among the plurality of connectors C1, C2, C3, and C4 as described in more detail below.

As described above, when monitoring the detection circuit 10 connected to the connectors C1, C2, C3, and C4 for connecting the high voltage components of the eco-friendly vehicle, the resistors 20 are used to specifically recognize which connector C1, C2, C3, or C4 among the plurality of connectors C1, C2, C3, and C4 is disengaged and to identify how many connectors among the plurality of connectors C1, C2, C3, and C4 are disengaged. Thus, the resistors 20 make it possible to effectively find and repair only an abnormal one among the plurality of connectors C1, C2, C3, and C4 when the vehicle is inspected and repaired.

Figure 3:
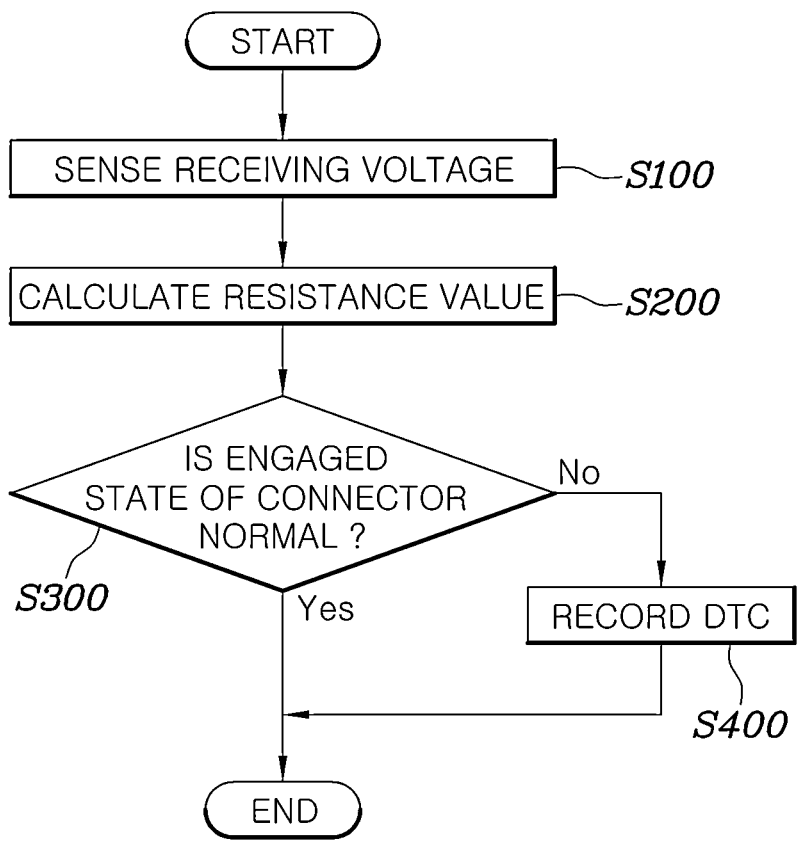
FIG. 3 is a flowchart of an interlock diagnosing method for a high voltage device according to an embodiment of the present disclosure.

FIG. 3 is a flowchart of an interlock diagnosing method for a high voltage device according to an embodiment of the present disclosure.

Referring further to FIG. 3, the interlock diagnosing method for a high voltage device according to an embodiment of the present disclosure uses an interlock diagnosing circuit. The interlock detection circuit includes a detection circuit 10 extending between a transmitter 30 providing a voltage and a receiver 40 receiving the voltage provided by the transmitter 30. The interlock detection circuit also includes a plurality of resistors 20, each being connected in parallel to the detection circuit 10 via a respective one of a plurality of connectors C1, C2, C3, and C4 engaged between the plurality of resistors 20 and the detection circuit 10. The interlock detection method includes detecting engaged states of the plurality of connectors C1, C2, C3, and C4 based on the voltage provided by the transmitter 30 or the voltage received by the receiver 40 (S300).

Before the detecting of the engaged states of the connectors C1, C2, C3, and C4 (S300), the interlock diagnosing method may further include calculating a resistance value of the detection circuit 10 based on the voltage provided by the transmitter 30 and the voltage received by the receiver 40 (S200). In the detecting of the engaged states of the connectors C1, C2, C3, and C4, the engaged states of the plurality of connectors C1, C2, C3, and C4 may be detected based on the calculated resistance value.

Before the calculating of the resistance value of the detection circuit 10 (S200), the interlock diagnosing method may further include sensing the voltage received by the receiver 40 (S100).

The plurality of resistors 20 may have different resistance values from each other. In the detecting of the engaged states of the connectors C1, C2, C3, and C4, a disengaged connector C1, C2, C3, or C4 among the plurality of connectors C1, C2, C3, and C4 may be detected based on the calculated resistance value.

After the detecting of the engaged states of the connectors C1, C2, C3, and C4 (S300), the interlock diagnosing method may further include recording an abnormal diagnostic trouble code (DTC) when the engagement of the connector C1, C2, C3, or C4 is abnormal (S400).

In the interlock diagnosing system and method for a high voltage device according to the present disclosure, the engaged states of the plurality of connectors can be diagnosed simultaneously.

In addition, even though a short circuit occurs due to the burn-out of the resistor or the like, a position of a connector having a problem can be detected.

Although the present disclosure has been shown and described with respect to specific embodiments, it should be apparent to those having ordinary skill in the art that the present disclosure may be variously modified and altered without departing from the spirit and scope of the present disclosure as defined by the following claims.

What is claimed is:

1. An interlock diagnosing system for a high voltage device, the interlock diagnosing system comprising:
   a detection circuit extending between a transmitter providing a voltage and a receiver receiving the voltage provided by the transmitter;
   a plurality of resistors, each being connected in parallel to the detection circuit via a respective one of a plurality of connectors engaged between the plurality of resistors and the detection circuit; and
   a detector detecting engaged states of the plurality of connectors based on at least one of the voltage provided by the transmitter or the voltage received by the receiver, or both,
   wherein the detector calculates a resistance value of the detection circuit based on the voltage provided by the transmitter and the voltage received by the receiver and detects the engaged states of the plurality of connectors based on the calculated resistance value, wherein each resistor of the plurality of resistors has a different resistance value from each other, wherein the detector detects a disengaged connector among the plurality of connectors based on the calculated resistance value, and wherein the detector is directly connected to the receiver.

2. The interlock diagnosing system of claim 1, wherein the plurality of resistors is included in an integrated resistor board.

3. The interlock diagnosing system of claim 1, wherein the transmitter includes a voltage provider and a voltage dividing resistor for dividing the voltage provided by the voltage provider.

4. The interlock diagnosing system of claim 1, wherein each of the plurality of connectors is connected to the detection circuit and any one of the plurality of resistors, and connects the resistor connected thereto in an engaged state to the detection circuit in parallel.

5. An interlock diagnosing method for a high voltage device using an interlock diagnosing circuit, the interlock diagnosing method comprising:

calculating a resistance value of a detection circuit included in the interlock diagnosing circuit, the detection circuit extending between a transmitter providing a voltage and a receiver receiving the voltage provided by the transmitter and including a plurality of resistors, based on the voltage provided by the transmitter and the voltage received by the receiver; and detecting, by a detector directly connected to the receiver, engaged states of a plurality of connectors based on at least the voltage provided by the transmitter or the voltage received by the receiver, the plurality of connectors engaged between the plurality of resistors and the detection circuit, each resistor of the plurality of resistors being connected in parallel to the detection circuit via a respective connector of the plurality of connectors, wherein, in detecting the engaged states of the plurality of connectors, the engaged states of the plurality of connectors are detected based on the calculated resistance value, wherein each resistor of the plurality of resistors has a different resistance value from each other, wherein, in detecting the engaged states of the plurality of connectors, a disengaged connector among the plurality of connectors is detected based on the calculated resistance value.

6. An interlock diagnosing system for a high voltage device, the interlock diagnosing system comprising:

a transmitter providing a voltage;

a receiver receiving the voltage provided by the transmitter;

a detection circuit extending between the transmitter and the receiver;

a plurality of resistors, each resistor thereof being connected in parallel to the detection circuit via a respective one of a plurality of connectors engaged between the plurality of resistors and the detection circuit;

a detector detecting engaged states of the plurality of connectors based on at least the voltage provided by the transmitter or the voltage received by the receiver; and voltage dividing resistors including two resistors, wherein the detection circuit is directly connected to a node between the two resistors, and wherein the detector is directly connected to the receiver.

7. The interlock diagnosing system of claim 6, wherein the plurality of resistors is included in an integrated resistor board.

8. The interlock diagnosing system of claim 6, wherein each connector of the plurality of connectors is connected to the detection circuit and any one of the plurality of resistors, and wherein each connector of the plurality of connectors connects the resistor connected thereto in an engaged state to the detection circuit in parallel.

9. The interlock diagnosing system of claim 6, wherein the detector calculates a resistance value of the detection circuit based on the voltage provided by the transmitter and the voltage received by the receiver, and wherein the detector detects the engaged states of the plurality of connectors based on the calculated resistance value.

10. The interlock diagnosing system of claim 9, wherein each resistor of the plurality of resistors has a different resistance value from each other, and wherein the detector detects a disengaged connector among the plurality of connectors based on the calculated resistance value.

* * * * *